US012640734B2

(12) United States Patent
Chen

(10) Patent No.: US 12,640,734 B2
(45) Date of Patent: May 26, 2026

(54) SENSING DEVICE

(71) Applicant: INTERLINK ELECTRONICS, INC., Irvine, CA (US)

(72) Inventor: Gene Chen, Camarillo, CA (US)

(73) Assignee: INTERLINK ELECTRONICS, INC., Irvine, CA (US)

( * ) Notice: Subject to any disclaimer, the term of this patent is extended or adjusted under 35 U.S.C. 154(b) by 181 days.

(21) Appl. No.: 18/446,325

(22) Filed: Aug. 8, 2023

(65) Prior Publication Data

US 2024/0072800 A1    Feb. 29, 2024

Related U.S. Application Data

(60) Provisional application No. 63/374,015, filed on Aug. 31, 2022.

(51) Int. Cl.
H03K 17/96 (2006.01)
(52) U.S. Cl.
CPC ......... H03K 17/964 (2013.01); H03K 17/962 (2013.01); H03K 17/9645 (2013.01); *H03K 2017/9604* (2013.01)
(58) Field of Classification Search
CPC ............. H03K 17/962; H03K 17/9625; H03K 17/964; H03K 17/9645; H03K 2017/9604; H03K 3/00; H03K 4/00; H03K 5/00; H03K 6/00; H03K 7/00; H03K 9/00; H03K 11/00; H03K 12/00;

H03K 17/00; H03K 19/00; H03K 21/00; H03K 23/00; H03K 25/00; H03K 27/00; H03K 29/00; H03K 99/00; H03K 2217/00
See application file for complete search history.

(56) References Cited

U.S. PATENT DOCUMENTS

| | | | |
|---|---|---|---|
| 8,421,483 B2 | 4/2013 | Klinghult et al. | |
| 9,116,569 B2 | 8/2015 | Stacy et al. | |
| 2013/0194062 A1* | 8/2013 | Rosenblatt | H02J 50/80 340/4.3 |
| 2017/0262099 A1* | 9/2017 | Nathan | G06F 3/0443 |
| 2019/0025923 A1* | 1/2019 | Kim | G06F 3/0447 |
| 2019/0087046 A1 | 3/2019 | Guo et al. | |
| 2020/0293132 A1 | 9/2020 | Nathan et al. | |

OTHER PUBLICATIONS

International Search Report and Written Opinion issued in corresponding application No. PCT/US2023/030187, dated Nov. 16, 2023.

* cited by examiner

*Primary Examiner* — Judy Nguyen
*Assistant Examiner* — Brent J Andrews
(74) *Attorney, Agent, or Firm* — Maschoff Brennan

(57) ABSTRACT
A sensing device may include a first sensor of a first type. The first sensor may include a first conductive element, a second conductive element, and a reactive material between the first conductive element and the second conductive element. The sensing device further including a second sensor of a second type that may be different from the first type. The second sensor may use the first conductive element as a conductive element in the second sensor.

16 Claims, 5 Drawing Sheets

501a

501b 502a  502b

SENSING DEVICE

FIELD

The embodiments discussed herein are related to a sensing device.

BACKGROUND

Sensors may be used to collect information or data. In some instances, sensors may be used to allow a user to interact with a system. For example, a capacitive sensor in a touch screen may be used to allow a user to interact with graphical user interface of a device. As another example, a resistive force sensor may be used to allow a user to interact with a graphical user interface of a device. Sensors may be used to allow a user to interact with systems other than graphical user interfaces.

The subject matter claimed herein is not limited to embodiments that solve any disadvantages or that operate only in environments such as those described above. Rather, this background is only provided to illustrate one example technology area where some embodiments described herein may be practiced.

SUMMARY

A sensing device may include a first sensor of a first type. The first sensor may include a first conductive element, a second conductive element, and a reactive material between the first conductive element and the second conductive element. The sensing device further including a second sensor of a second type that may be different from the first type. The second sensor may use the first conductive element as a conductive element in the second sensor.

BRIEF DESCRIPTION OF THE DRAWINGS

Example embodiments will be described and explained with additional specificity and detail through the use of the accompanying drawings in which.

DETAILED DESCRIPTION

Multiple different types of sensors may be used to determine human or other object interactions with other devices or objects. For example, a force sensitive resistor sensor, a piezoelectric sensor, and a capacitive sensor may each be used individually to determine human or other object interactions with other devices or objects. Each of these types of sensors may include a different configuration. As a result, each of these types of sensors may provide varying capabilities in different situations. For example, a capacitive sensor may have a faster response time than a force sensitive resistor sensor. However, a force sensitive resistor sensor may not be affected as much by external conditions, such as a change in environmental conditions. As another example, a force sensitive resistor sensor may not respond to a short interaction as well as a piezoelectric sensor. However, the force sensitive resistor sensor may provide a better indication of a location of a force be applied than the piezoelectric sensor.

Some embodiments of the present disclosure are directed to a sensing device that is configured to combine two or more sensor types in a single integrated sensor stack. For example, the sensing device may include two or more sensor types from a group of sensor types including a force sensitive resistor sensor, a piezoelectric sensor, and a capacitive sensor. The two or more sensor types may be arranged in an overlapping fashion in the integrated sensor stack such that an interaction with the integrated sensor stack may result in each sensor in the integrated sensor stack sensing the interaction.

Figure 1:
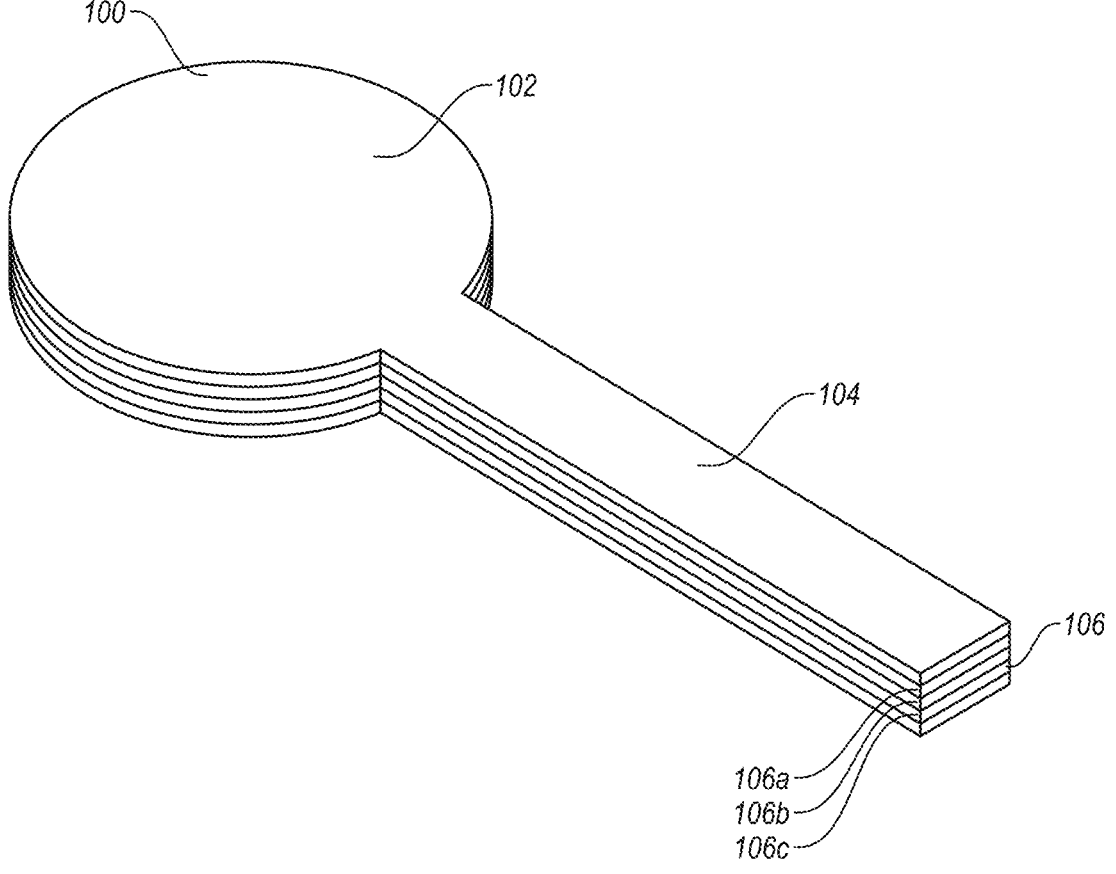
FIG. 1 illustrates an example sensing device.

FIG. 1 illustrates a sensing device 100, in accordance with some embodiments of the present disclosure. The sensing device 100 includes a sensing area 102, a tail 104, a first pin 106a, a second pin 106b, and a third pin 106c, referred to collectively as the connector pins 106.

In some embodiments, the sensing device 100 may include an integrated sensor stack that includes multiple sensors. For example, the integrated sensor stack may include two or more sensors that are arranged in an overlapping fashion in the integrated sensor stack. For example, the integrated sensor stack may include two or more sensors that are arranged in a vertically overlapping fashion in the integrated sensor stack. For example, the sensing device 100 may include a top surface and a bottom surface of the sensing area 102. In these and other embodiments, the two or more sensors may be arranged in a vertically overlapping fashion between the top surface and the bottom surface. In these and other embodiments, the two or more sensors may be arranged in a vertically overlapping fashion such that the two or more sensors are directly between the top surface and the bottom surface.

In some embodiments, the two or more sensors may be configured such that a footprint of each of the two or more sensors is the same. In these and other embodiments, a footprint of a sensor may include a shape and dimensions of an outer periphery of the sensor. Alternately or additionally, a size of a footprint of each of the two or more sensors may be in a range of a size of a footprint of others of the two or more sensors. For example, the sizes of the footprints of the sensors may be within 5, 10, 15, 20, 25, 30, 35, 40, 45, or 50 percent of each other.

The sensors in the integrated sensor stack may include a force sensitive resistor sensor, a piezoelectric sensor, and/or a capacitive sensor. For example, the sensing device 100 may include the force sensitive resistor sensor, the piezoelectric sensor, and the capacitive sensor. Alternately or additionally, the sensing device 100 may include the force sensitive resistor sensor and the piezoelectric sensor. Alternately or additionally, the sensing device 100 may include the force sensitive resistor sensor and the capacitive sensor. Alternately or additionally, the sensing device 100 may include the piezoelectric sensor and the capacitive sensor.

In some embodiments, the piezoelectric sensor in the sensing device 100 may be used to measure strain, stretching, bending, vibration, tapping, pressing force, pinching, touching, rubbing, dragging, twisting, among other sensations that may be applied to the sensing device 100. Alternately or additionally, the piezoelectric sensor in the sensing device 100 may also be used as a piezoelectric actuator to produce mechanical vibration to provide haptic feedback, such as feedback that may be felt by a human. In these and other embodiments, the piezoelectric sensor may produce mechanical vibration in response to an applied waveform, such as an alternating current (AC) voltage, being applied to the piezoelectric sensor. Alternately or additionally, the piezoelectric sensor may also be used as a pyroelectric sensor to detect temperature change.

In some embodiments, the piezoelectric sensor in the sensing device 100 may include a polymeric piezoelectric material such as Polyvinylidene Fluoride (PVDF), or any derivatives thereof, among other types of polymeric piezoelectric materials. Alternately or additionally, the piezoelectric sensor in the sensing device 100 may comprise a ceramic piezo material such as lead zirconate titanate (PZT) or scandium-doped aluminum nitride (ScAlN), among other types of ceramic piezo material. In these and other embodiments, the ceramic piezo material may include a thin membrane ceramic piezo material.

In some embodiments, the piezoelectric sensor in the sensing device 100 may be formed using ink formulations containing nano-sized or micro-sized particles of piezoelectric materials or monomers of piezoelectric polymers. Other methods of forming the piezoelectric sensor may also be used.

In some embodiments, the capacitive sensor in the sensing device 100 may be a mutual-capacitive sensor or a self-capacitive sensor. The capacitive sensor may be used to measure proximity, touching, pressing force, pinching, or relative displacement of one surface to the other, among other sensations. In some embodiments, the capacitive sensor may be divided into at least two distinctive regions so that the regions may be measured independently. The independent measurement of the regions may occur simultaneously or sequentially.

In some embodiments, the force sensitive resistor sensor (FSR) in the sensing device 100 may be a thru-mode FSR, a shunt-mode FSR, or other type of FSR. The FSR sensor may be used to measure touching, pressing force, pinching, or relative displacement of one surface to the other, among other sensations. The FSR sensor may be divided into at least two distinctive regions so that the regions may be measured independently. The independent measurement of the regions may occur simultaneously or sequentially.

In some embodiments, at least one layer in the sensing device 100 may be produced via printing. The printing may include screen printing, ink-jet printing, slot-die printing, spaying, dip printing, draw bar printing, doctor blade printing, spin coating, gravure printing, roll-to-roll printing, or any common technique used in printable electronics.

In some embodiments, at least one sensor in the sensing device 100 may be printed on a commonly used flexible substrate such as polyimides, polyamides, polyethylene terephthalate (PET), polystyrene (PS), polycarbonate (PC), polysulfone (PSU), polyethersulfone (PES), polyphenylene sulfone (PPSU), polyurethane (PU), thermoplastic polyurethane (TPU), silicones, siloxanes, natural rubber, thin glass, glass-reinforced epoxy resin laminate such as FR-4, printed circuit board (PCB), flexible printed circuit (FPC), thin ceramic, paper, leather, wood, or any commonly used materials in printable electronics.

In some embodiments, at least one conductive element in the sensing device 100 may be printed using a silver ink, copper ink, carbon ink, or any combinations thereof. In some embodiments, the integrated sensor stack may include a common sensing area 102 where the integrated sensors may sense an interaction with the sensing device 100. In these and other embodiments, each of the sensors in the sensing device 100 may be configured to sense interactions within the sensing area 102. For example, an interaction may include a force applied to the sensing area 102, a proximity of an approaching object, such as a finger of a user, or a rapid tapping, among other interactions.

The sensing area 102 may be coupled to the tail 104. The tail 104 may include the connector pins 106. Each of the sensors in the sensing device 100 may be coupled to one or more of the connector pins 106 via the tail 104. For example, a conductive material may run along the tail 104 between the sensors in the sensing area 102 and the connector pins 106.

In some embodiments, by way of the tail 104 and the connector pins 106, data may be obtained from the sensors. For example, via one or more of the connector pins 106, a change in capacitance of the capacitive sensor may be detected by a device coupled to the connector pins 106. Alternately or additionally, via one or more of the connector pins 106 an amount of resistance of the force sensitive resistor sensor may be detected. Alternately or additionally, via one or more of the connector pins 106 an amount of voltage of the piezoelectric sensor may be detected. In some embodiments, the connector pins 106 may be coupled to a computing system via a signal processing circuit.

As an example of operation of the sensing device 100, a force may be applied by a portion of a body of a person, such as a finger pressing on the sensing area 102. In these and other embodiments, the capacitive sensor may be configured to sense a change in capacitance within the capacitive sensor before the interaction and during the interaction with the sensing area 102. For example, as a finger approaches the sensing area 102, the finger may interact with an electric field of one or more conductive materials in the sensing device 100 resulting in a change of capacitance which may be detected by monitoring one or more of the connector pins 106.

Alternately or additionally, the piezoelectric sensor may be configured to sense the force applied to the sensing area 102. In these and other embodiments, the piezoelectric sensor may generate a voltage across two electrodes based on the force applied to piezoelectric material of the piezoelectric sensor. Alternately or additionally, the force sensitive resistor sensor or the capacitive sensor may be configured to sense the force applied to the sensing area 102. In these and other embodiments, the force sensitive resistor sensor may change a resistance between the two corresponding electrodes based on the force applied to the force sensitive resistor sensor, or the capacitive sensor may change capacitance corresponding to the applied force.

The combination of the three sensors arranged in an overlapping fashion in the integrated sensor stack may provide for some advantages. For example, a single location of the sensing area 102 may be configured to respond to multiple different types of interactions. For example, a hovering interaction may be sensed by the capacitive sensor. A short interaction or multiple short interactions in a narrow time frame may be sensed by the piezoelectric sensor. A long interaction may be sensed by the force sensitive resistor sensor. As another example, the piezoelectric sensor may be configured to determine an amount of a force and the force sensitive resistor sensor may be configured to determine a location of a force. As such, the integrated sensor stack may provide data with respect to location and amount of force of an interaction. Thus, a single integrated sensor stack may provide data on multiple different types of interactions and multiple different types of data for a single interaction.

In some embodiments, one or more conductive elements of one of the sensors in the integrated sensor stack of the sensing device 100 may be used as a conductive element of another one of the sensors in the integrated sensor stack. For example, the piezoelectric sensor may include a first electrode and a second electrode. The first electrode of the piezoelectric sensor may also be a conductive element or electrode of the force sensitive resistor sensor or the capacitive sensor. By sharing conductive elements or electrodes amongst the sensors in the integrated sensor stack, one or more dimensions of the integrated sensor stack may be reduced. Furthermore, by sharing conductive elements, a single interaction with the sensing area 102 may be sensed by multiple sensors in the integrated sensor stack simultaneously or sequentially.

In some embodiments, because the different sensors in the integrated sensor stack may operate at different voltage modes and/or frequencies, a processing circuit coupled to the sensing device 100 may include circuitry to isolate the signals from the different sensors to detect them. The isolation of the signal may help to reduce interference between the signals. Furthermore, having multiple sensors in the single integrated sensor stack may allow for the sensors to confirm an interaction and avoid false detection. For example, the capacitive sensor may sense an object in proximity to the sensing area 102, after the piezoelectric sensor may sense an interaction, followed by and/or at the same time as the force sensitive resistor sensor senses the interaction. In these and other embodiments, having the capacitive sensor, the force sensitive resistor sensor, and the piezoelectric sensor sense an interaction within a time period may confirm the interaction occurred. As such, the integrated sensor stack may reduce false positive interactions that may be sensed by a single sensor or even the combination of two types of sensors.

Alternately or additionally, the piezoelectric sensor may be used to measure temperature change when the piezoelectric materials of the piezoelectric sensor are pyroelectric. In these and other embodiments, to measure the temperature change a correlation between one or more forces measured by the FSR and/or capacitive sensor and one or more signals generated by the piezoelectric sensor may be made. For example, a change in the one or more signals generated by the piezoelectric sensor without a change in the one or more forces measured by the FSR and/or capacitive sensor may indicate a change in temperature.

In some embodiments, the temperature change may be associated with an approaching object, such as a finger of a human. As such, the piezoelectric sensor may provide additional information regarding an interaction with the sensing device 100.

In some embodiments, a piezoelectric sensor may detect both normal forces, as well as in-plane forces, i.e., a finger dragging, rubbing, or pinching on the surface of the sensor. An FSR or capacitive sensors may detect normal forces. As such, the measurements performed by all the sensors of the sensing device 100 may be used to detect interactions that include complex gestures applied to the sensing device 100.

Alternately or additionally, a piezoelectric element in sensing device 101 may also be used as piezoelectric actuator to generate vibration to produce different haptic feedback based on an interaction with the sensing device 100. For example, a voltage may be applied across the piezoelectric element to cause the piezoelectric element to vibrate.

Modifications, additions, or omissions may be made to FIG. 1 without departing from the scope of the present disclosure. For example, in some embodiments, the sensing area 102 may be any shape or configuration. For example, the sensing area 102 may be square, rectangular, hexagonal, ring shaped, or some of the shape other than circular as illustrated. The sensing area 102 may not be planar, it may have convex or concave curvatures. As another example, the tail 104 may be longer or shorter in comparison to the sensing area 102. Alternately or additionally, the sensing device 100 may not include the tail 104. In these and other embodiments, the connector pins 106 may be protruding from the sensing area 102.

As another example, the sensing device 100 may include more pins than the three connector pins 106 illustrated. For example, the sensing device 100 may include four, five, six, or more connector pins. Alternately or additionally, the sensing device 100 may include fewer pins than the three connector pins 106 illustrated. For example, when the sensing device 100 includes two sensors, the sensing device 100 may include two connector pins.

Figure 2:
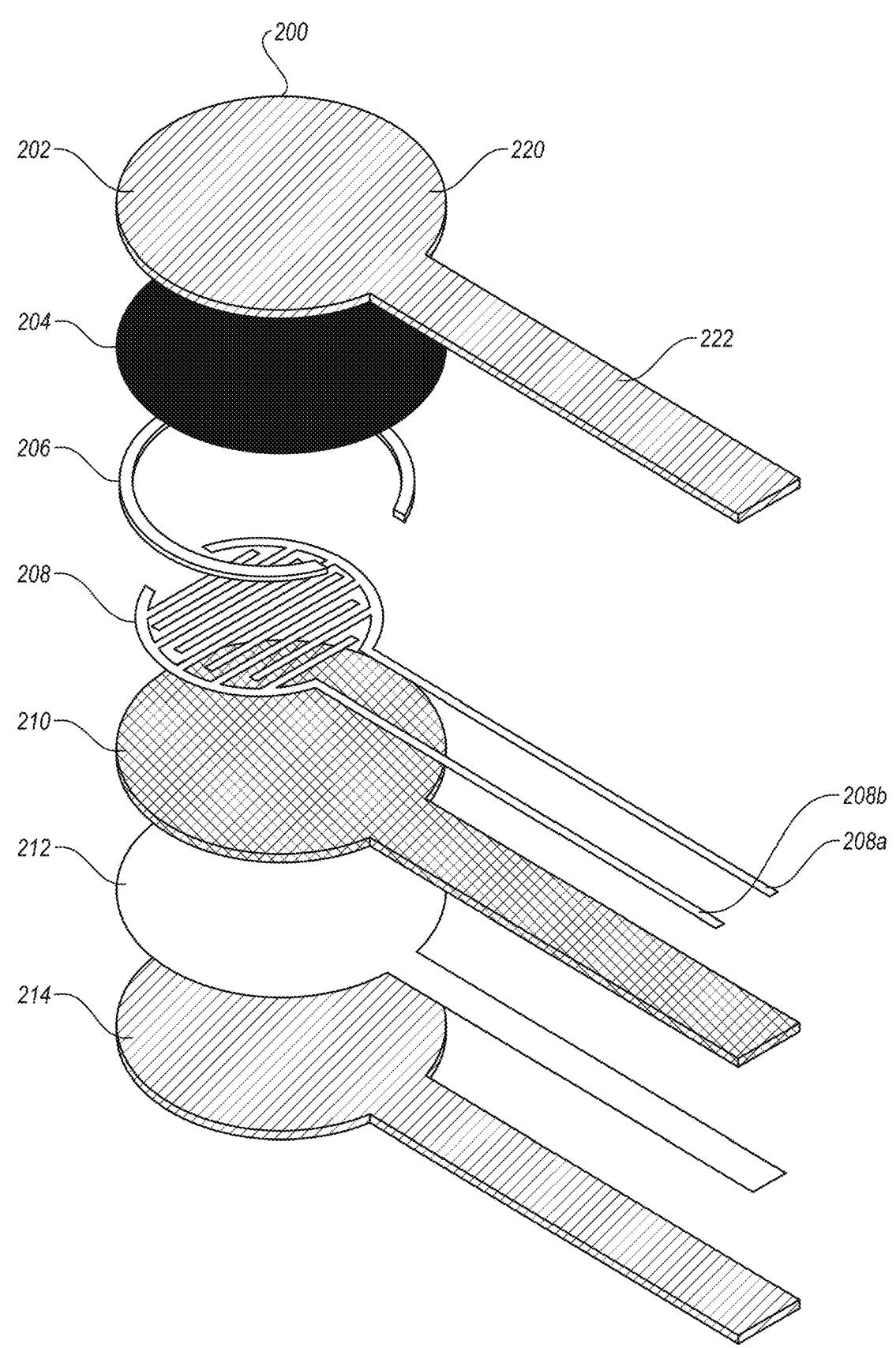
FIG. 2 illustrates an exploded view of another example sensing device.

FIG. 2 illustrates an exploded view of a sensing device 200, in accordance with some embodiments of the present disclosure. The sensing device 200 may be an example of the sensing device 100 of FIG. 1. In some embodiments, the sensing device 200 may be configured to include three sensors, such as a force sensitive resistor sensor, such as a shunt-mode force sensitive resistor sensor, a piezoelectric sensor, and a capacitive sensor.

As illustrated in FIG. 2, the sensing device 200 may include a first substrate 202, a piezoresistive material 204, a spacer 206, a conductive material 208, which includes a first electrode 208a and a second electrode 208b, a piezoelectric material 210, a conductive material 212, and a second substrate 214. Furthermore, the sensing device 200 may include a sensing region 220 and a tail region 222.

As illustrated, the sensing device 200 may be arranged as an integrated sensor stack, with three sensors vertically overlapping directly between the first substrate 202 and the second substrate 214. As illustrated, the sensing device 200 may include five materials between the first substrate 202 and the second substrate 214. The five materials may be arranged as five layers within the sensing device 200. In these and other embodiments, the five layers may include layers with conductive materials, such as the conductive materials 208 and 212. In these and other embodiments, the conductive materials may be materials that are electrically conductive. In these and other embodiments, the conductive materials may be conductive elements, such as electrodes. For example, the conductive materials may be formed as the first electrode 208a and the second electrode 208b or the electrodes illustrated in FIG. 5.

In some embodiments, the five layers may further include layers with reactive materials, such as the piezoresistive material 204 and the piezoelectric material 210. In these and other embodiments, the reactive materials may be materials that react to changes in pressure, force, or environmental conditions, such as temperature or humidity, among other conditions. For example, the reactive materials may change their electrical characteristics based on a force being applied to the reactive materials. As illustrated, the reactive layers may be separated by one or more of the conductive materials.

In some embodiments, the five layers may further include a layer with dielectric materials, such as the spacer 206. In these and other embodiments, the dielectric materials may be materials that are not electrically conductive. In these and other embodiments, the dielectric materials may be between the reactive materials and/or the conductive materials.

In some embodiments, two of the sensors within the sensing device 200 may use a single one of the conductive materials as an electrode. Thus, an electrode for a first sensor may function as an electrode for a second sensor within the sensing device 200.

Figure 3:
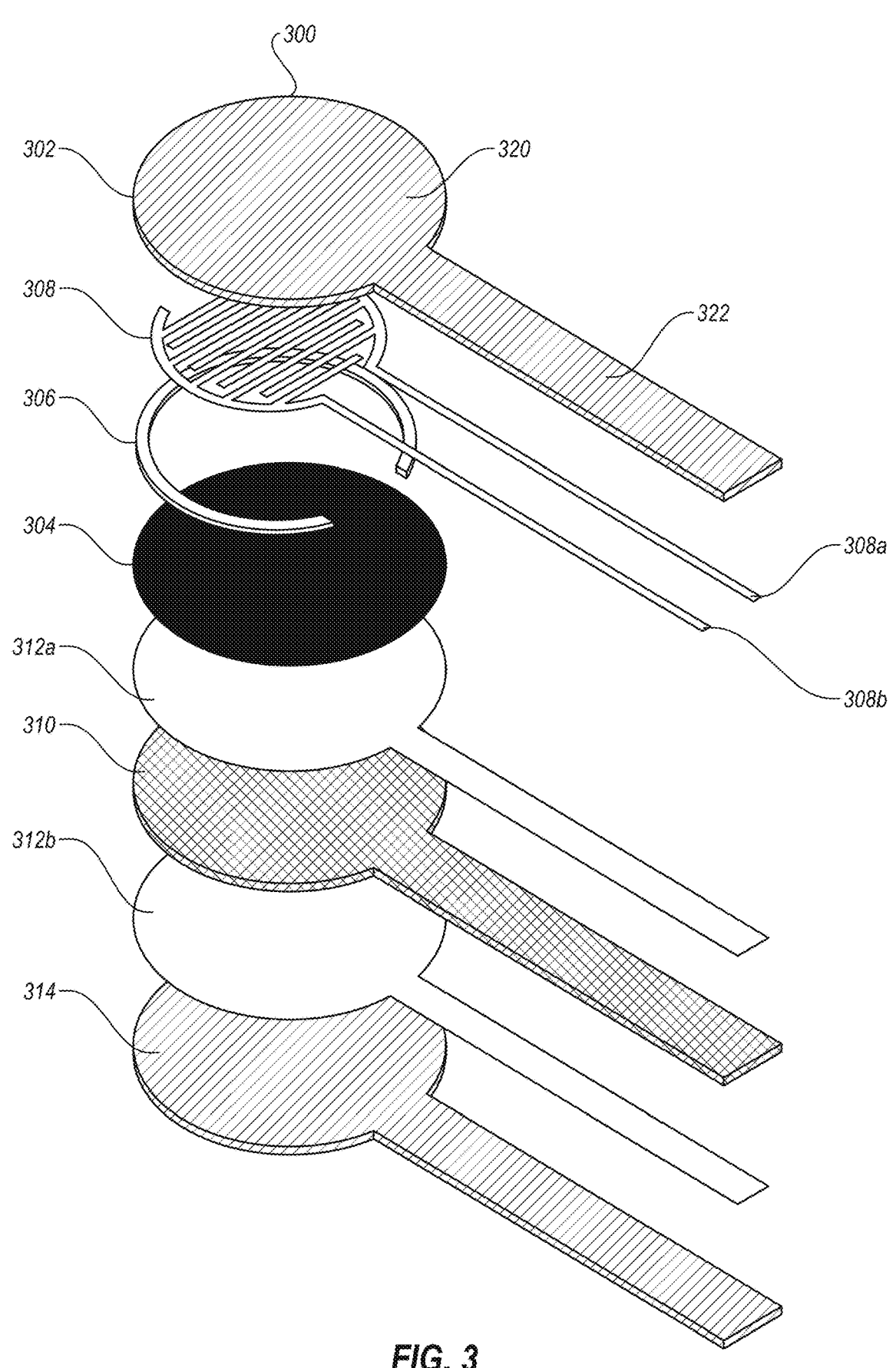
FIG. 3 illustrates an exploded view of another example sensing device.
Figure 4:
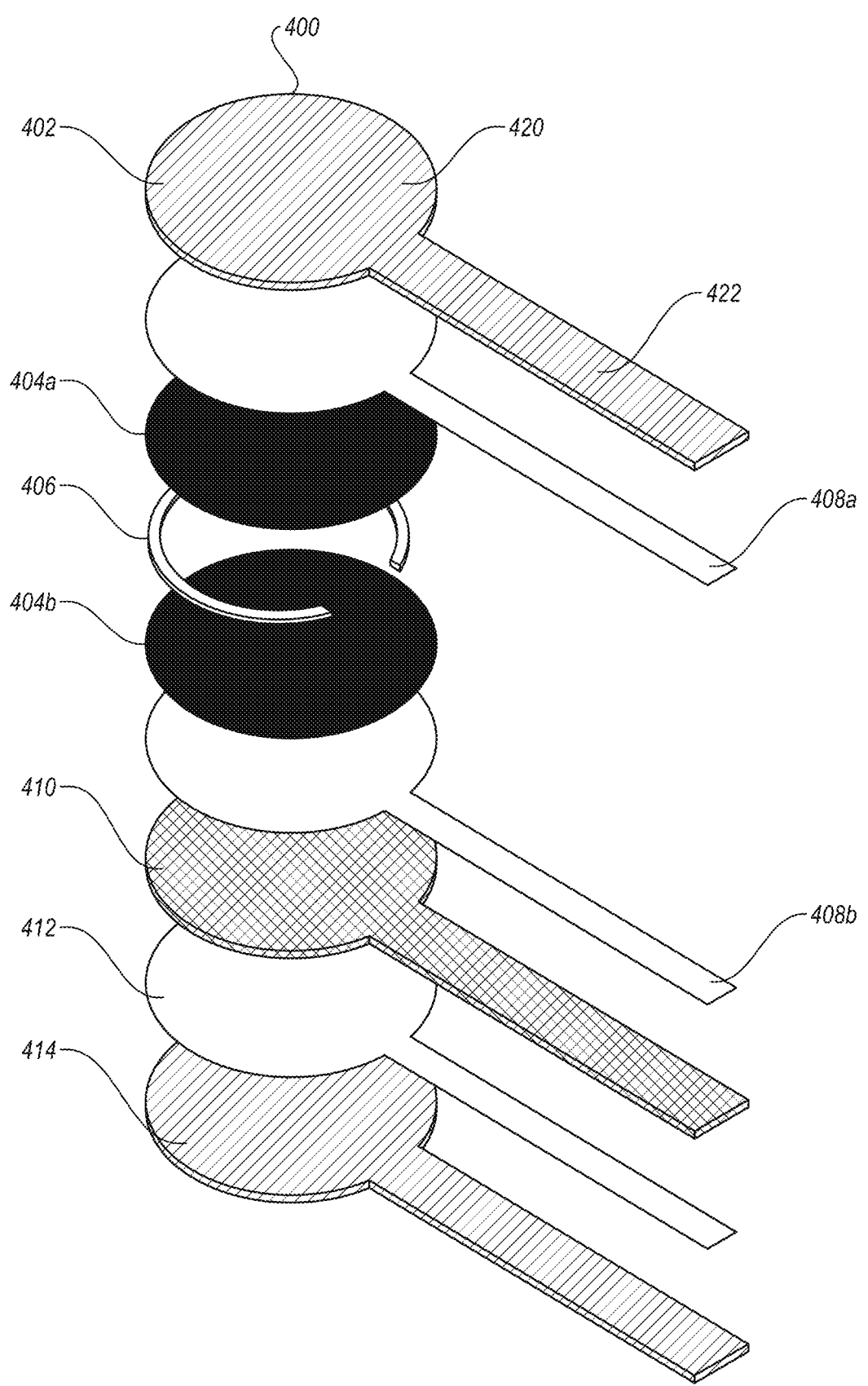
FIG. 4 illustrates an exploded view of another example sensing device.

Furthermore, the materials within the sensing device 200 may be formed in direct contact with each other. For example, the conductive material 212 may be formed in direct contact with the piezoelectric material 210. As another example, the piezoresistive material 204 may be in direct contact with the first substrate 202. For example, the piezoresistive material 204 may be printed on the first substrate 202. Alternately or additionally, one or more additional materials may be placed between the materials or layers of the sensing device 200 as described. FIGS. 3 and 4 provide alternative arrangements of materials to generate a sensing device that includes three sensors.

As illustrated in FIG. 2, the piezoresistive material 204, the spacer 206, and the conductive material 208 may be used as a shunt-mode force sensitive resistor sensor. In these and other embodiments, the spacer 206 may maintain a gap between the piezoresistive material 204 and the conductive material 208 unless a force is applied to the sensing region 220. When a force is applied to the sensing region 220, the piezoresistive material 204 may contact the conductive material 208. For example, the piezoresistive material 204 may contact a portion of the first electrode 208a and the second electrode 208b. As such, a resistance may be formed between the first electrode 208a and the second electrode 208b that may be determined by a device coupled to the first electrode 208a and the second electrode 208b. Based on the resistance, it may be determined that a force is applied to the sensing region 220.

In some embodiments, the conductive material 208, the piezoelectric material 210, and the conductive material 212 may be used as the piezoelectric sensor. In these and other embodiments, when a force is applied to the piezoelectric material 210, a voltage may be generated between the conductive material 208 and the conductive material 212. The voltage may be measured by a device coupled to the conductive material 208 and the conductive material 212. Based on the voltage, it may be determined that a force is applied to the sensing region 220. In some embodiments, one or both of the first electrode 208a and the second electrode 208b may be used for the piezoelectric sensor.

In some embodiments, a voltage may be placed across the conductive material 208 and the conductive material 212. In these and other embodiments, the voltage may cause the piezoelectric material 210 to move, e.g., vibrate, or make a sound. As a result, the sensing device 200 may provide haptic feedback.

In some embodiments, the conductive material 208 may be used as a mutual-capacitive proximity sensor. In these and other embodiments, when an object that may apply force to the sensing region 220 comes near the conductive material 208, the object changes the electric field between first and second electrodes 208a and 208b of the conductive material 208 resulting in a change in capacitance between the first and second electrodes 208a and 208b, that may be determined by a device coupled to the first and second electrodes 208a and 208b. Based on the change of capacitance, it may be determined that an object is near or touching the sensing region 220.

In some embodiments, the conductive material 212 may be used as a self-capacitive proximity sensor. In these and other embodiments, when an object that applies the force to the sensing region 220 comes near the conductive material 212, the object changes the electric field around conductive material 212 and thus change the capacitance between the conductive material 212 and ground. The change in capacitance may be determined by a device coupled to the conductive material 212 and ground. Based on the change of capacitance, it may be determined that an object is near or touching the sensing region 220.

In some embodiments, the conductive materials 212 and 208 may be used as a capacitive force sensing sensor. In these and other embodiments, the first and second electrodes 208a and 208b may be connected to a single conductor and form a capacitor with conductive material 212. When a force is applied to the sensing region 220, due to the deformation of piezoelectric material 210, the capacitance between the conductive materials 208 and 212 changes corresponding to the applied force, that may be determined by a device coupled to conductive materials 212 and 208.

In some embodiments, the first substrate 202 and the second substrate 214 may be dielectric materials and may be formed of flexible material to allow a force applied to the sensing region 220 to be applied to the piezoresistive material 204 and/or the piezoelectric material 210. For example, the first substrate 202 and the second substrate 214 may be a flexible polymer, such as a polyimide, or other flexible dielectric material.

In some embodiments, the spacer 206 may be a dielectric material, such as the same or different material than the first substrate 202 and the second substrate 214. The conductive material 208 and the conductive material 212 may be formed of conductive materials such as carbon, copper, silver, nickel, aluminum, or other conductive material.

In some embodiments, the piezoresistive material 204 may be printed on the first substrate 202. In these and other embodiments, the conductive material 208 may be printed on a first side of the piezoelectric material 210. In these and other embodiments, the conductive material 208 may be printed with a design as illustrated with the first electrode 208a and the second electrode 208b having interweaving arms. In these and other embodiments, the first electrode 208a may be coupled to a first pin of the sensing device 200 and the second electrode 208b may be coupled to a second pin of the sensing device 200.

Alternately or additionally, the first electrode 208a and the second electrode 208b may have different designs. In these and other embodiments, based on the design of the conductive material 208, a device coupled to the conductive material 208 may be configured to determine a location of a force applied within the sensing region 220. Alternately or additionally, based on the design of the conductive material 208, a device coupled to the conductive material 208 may be configured to determine a motion of a force that moves across a surface of the sensing region 220, such as a swiping motion across the surface of the sensing region 220. Thus, the device may be configured to determine a difference between a press in multiple different locations and a swiping motion in multiple different locations from the force sensitive resistor sensor. As an example, U.S. Pat. No. 6,239,790 granted on May 29, 2001, and U.S. Pat. No. 6,909,354 granted on Jun. 21, 2005, describe various configurations of force sensitive resistor sensors, and are incorporated herein by reference in their entireties.

In some embodiments, the spacer 206 may be a dielectric adhesive that may be applied to couple the first substrate 202 and the first side of the piezoelectric material 210. Alternately or additionally, the spacer 206 may be a separate material that is coupled to the first substrate 202 and the piezoelectric material 210 using an adhesive.

In these and other embodiments, the conductive material 212 may be printed on a second side of the piezoelectric material 210 that is opposite the first side. In these and other embodiments, an adhesive may be used to couple the piezoelectric material 210 and the second substrate 214.

Alternately or additionally, the conductive material 212 may be a conductive adhesive that may be used to couple the piezoelectric material 210 and the second substrate 214. In some embodiments, the conductive material 212 may be coupled to a pin of the sensing device 200. In these and other embodiments, the sensing device 200 may include three pins.

In these and other embodiments, the conductive material 212 may be deposited on the second substrate 214, and then coupled to the piezoelectric material 210 using a conductive adhesive. In these and other embodiments, the conductive material 212 and the second substrate 214 may be part of flexible printed circuit (FPC) or a printed circuit board (PCB).

Modifications, additions, or omissions may be made to FIG. 2 without departing from the scope of the present disclosure. For example, in some embodiments, the sensing device 200 may include fewer materials, layer, and/or elements. For example, when the sensing device 200 includes a force sensitive resistor sensor and a capacitive sensor, the sensing device 200 may not include the piezoelectric material 210 and the conductive material 212. In these and other embodiments, the conductive material 208 may be used for the capacitive sensor. Alternately or additionally, the conductive material 208 may have a different configuration or design. For example, the conductive material 208 may have a design similar to a design from U.S. Pat. Nos. 6,239,790 and 6,909,354 incorporated herein by reference. Alternately or additionally, the conductive material 208 may have a design similar to the designs illustrated in FIG. 5 or some other design.

Alternately or additionally, the conductive material 212 and the second substrate 214 may be part of a flexible printed circuit (FPC) or a printed circuit board (PCB). Alternately or additionally, the first substrate 202 may be part of a flexible printed circuit (FPC) or a printed circuit board (PCB).

FIG. 3 illustrates an exploded view of a sensing device 300, in accordance with some embodiments of the present disclosure. As illustrated in FIG. 3, the sensing device 300 may include a first substrate 302, a conductive material 308, a spacer 306, a piezoresistive material 304, a conductive material 312a, a piezoelectric material 310, a conductive material 312b, and a second substrate 314. Furthermore, the sensing device 300 may include a sensing region 320 and a tail region 322.

As illustrated, the sensing device 300 may be arranged as an integrated sensor stack, with three sensors vertically overlapping directly between the first substrate 302 and the second substrate 314. As illustrated, the sensing device 300 may include six materials between the first substrate 302 and the second substrate 314. The six materials may be arranged as six layers within the sensing device 300. In these and other embodiments, the six layers may include layers with conductive materials, such as the conductive materials 308 and 312. In some embodiments, the six layers may further include layers with reactive materials, such as the piezoresistive material 304 and the piezoelectric material 310. In some embodiments, the six layers may further include a layer with dielectric materials, such as the spacer 306.

In some embodiments, two of the sensors within the sensing device 300 may use a single one of the conductive materials as an electrode. Thus, an electrode for a first sensor may function as an electrode for a second sensor within the sensing device 300. Furthermore, the materials within the sensing device 300 may be formed in direct contact with each other.

In some embodiments, the piezoresistive material 304, the spacer 306, and the conductive material 308 may be used as a shunt-mode force sensitive resistor sensor. In these and other embodiments, the spacer 306 may maintain a gap between the piezoresistive material 304 and the conductive material 308 unless a force is applied to the sensing region 320. In these and other embodiments, the conductive material 312a may be deposited directly on the piezoelectric material 310, and the piezoresistive material 304 may be then deposited directly on the conductive material 312a. Alternately or additionally, the piezoresistive material 304 may be deposited on another carrier than deposited on the conductive material 312a. In these and other embodiments the conductive material 308 may be deposited on the first substrate 302. Alternately or additionally, the conductive material 308 and the first substrate 302 may be part of a flexible printed circuit (FPC) or a printed circuit board (PCB). In these and other embodiments, the conductive material 312b may be deposited on the second substrate 314, and then coupled to the piezoelectric material 310 using a conductive adhesive. In these and other embodiments, the conductive material 312b and second substrate 314 may be part of a flexible printed circuit (FPC) or a printed circuit board (PCB).

In some embodiments, the conductive material 312a, the piezoelectric material 310, and the conductive material 312b may be used as the piezoelectric sensor. In some embodiments, the conductive material 308 may be used as a mutual-capacitive proximity sensor. In some embodiments, the conductive material 312a or conductive material 312b may be used as a self-capacitive proximity sensor. Alternately or additionally, the conductive material 312a and conductive material 312b may be used as a capacitive force sensing sensor.

Modifications, additions, or omissions may be made to FIG. 3 without departing from the scope of the present disclosure. For example, in some embodiments, the sensing device 300 may include fewer materials, layer, and/or elements. For example, when the sensing device 300 includes a force sensitive resistor sensor and a capacitive sensor, the sensing device 300 may not include the piezoelectric material 310 and the conductive material 312b. Alternately or additionally, the conductive materials 308 may have a different configuration or design. For example, the conductive material 208 may have a design similar to a design from U.S. Pat. Nos. 6,239,790 and 6,909,354 incorporated herein by reference. Alternately or additionally, the conductive material 208 may have a design similar to the designs illustrated in FIG. 5 or some other design.

FIG. 4 illustrates an exploded view of a sensing device 400, in accordance with some embodiments of the present disclosure. As illustrated FIG. 4, the sensing device 400 may include a first substrate 402, piezoresistive materials including a first piezoresistive material 404a and a second piezoresistive material 404b, a spacer 406, conductive elements including a first conductive material 408a and a second conductive material 408b, a piezoelectric material 410, a conductive material 412, and a second substrate 414. Furthermore, the sensing device 400 may include a sensing region 420 and a tail region 422.

As illustrated, the sensing device 400 may be arranged as an integrated sensor stack, with three sensors vertically overlapping directly between the first substrate 402 and the second substrate 414. As illustrated, the sensing device 400 may include seven materials between the first substrate 402 and the second substrate 414. The seven materials may be arranged as seven layers within the sensing device 400. In these and other embodiments, the seven layers may include layers with conductive materials, such as the conductive materials 408 and 412. In some embodiments, the seven layers may further include layers with reactive materials, such as the piezoresistive material 404 and the piezoelectric material 410. In some embodiments, the seven layers may further include a layer with dielectric materials, such as the spacer 406.

In some embodiments, two of the sensors within the sensing device 400 may use a single one of the conductive materials as an electrode. Thus, an electrode for a first sensor may function as an electrode for a second sensor within the sensing device 400. Furthermore, the materials within the sensing device 400 may be formed in direct contact with each other.

In some embodiments, the first and second piezoresistive materials 404a and 404b, the spacer 406, and the first and second materials 408a and 408b may form a thru-mode force sensitive resistor sensor. In these and other embodiments, the spacer 406 may maintain a gap between the first and second piezoresistive materials 404a and 404b, unless a force is applied to the sensing region 420. When a force is applied to the sensing region 420, the first and second piezoresistive materials 404a and 404b may contact each other. As such, a resistance may be formed between the first conductive material 408a and the second conductive material 408b that may be determined by a device coupled to the first conductive material 408a and the second conductive material 408b. Based on the resistance, it may be determined that a force is applied to the sensing region 420.

In these and other embodiments, the conductive material 412 may be deposited on the second substrate 414, and then coupled to the piezoelectric material 410 using a conductive adhesive. Alternately or additionally, the conductive material 412 and the second substrate 414 may be part of a flexible printed circuit (FPC) or a printed circuit board (PCB). In these and other embodiments the first material 408a may be deposited on the first substrate 402. Alternately or additionally, the first material 408a and the first substrate 402 may be part of a flexible printed circuit (FPC) or a printed circuit board (PCB).

In some embodiments, the conductive material 408b, the piezoelectric material 410, and the conductive material 412 may be used as the piezoelectric sensor. In some embodiments, the conductive material 408a, 408b, or 412 may be used as a mutual-capacitive proximity sensor. In some embodiments, the conductive material 408a, 408b, or 412 or conductive material 408a, 408b, or 412 may be used as a self-capacitive proximity sensor. Alternately or additionally, the conductive material 408b and conductive material 412 may be used as a capacitive force sensing sensor.

Modifications, additions, or omissions may be made to FIG. 4 without departing from the scope of the present disclosure. For example, in some embodiments, the sensing device 400 may include fewer materials, layer, and/or elements. For example, when the sensing device 400 includes a force sensitive resistor sensor and a capacitive sensor, the sensing device 400 may not include the piezoelectric material 410 and the conductive material 412. Alternately or additionally, the conductive materials 408a or 408b may have a different configuration or design as described in this disclosure.

Figure 5:
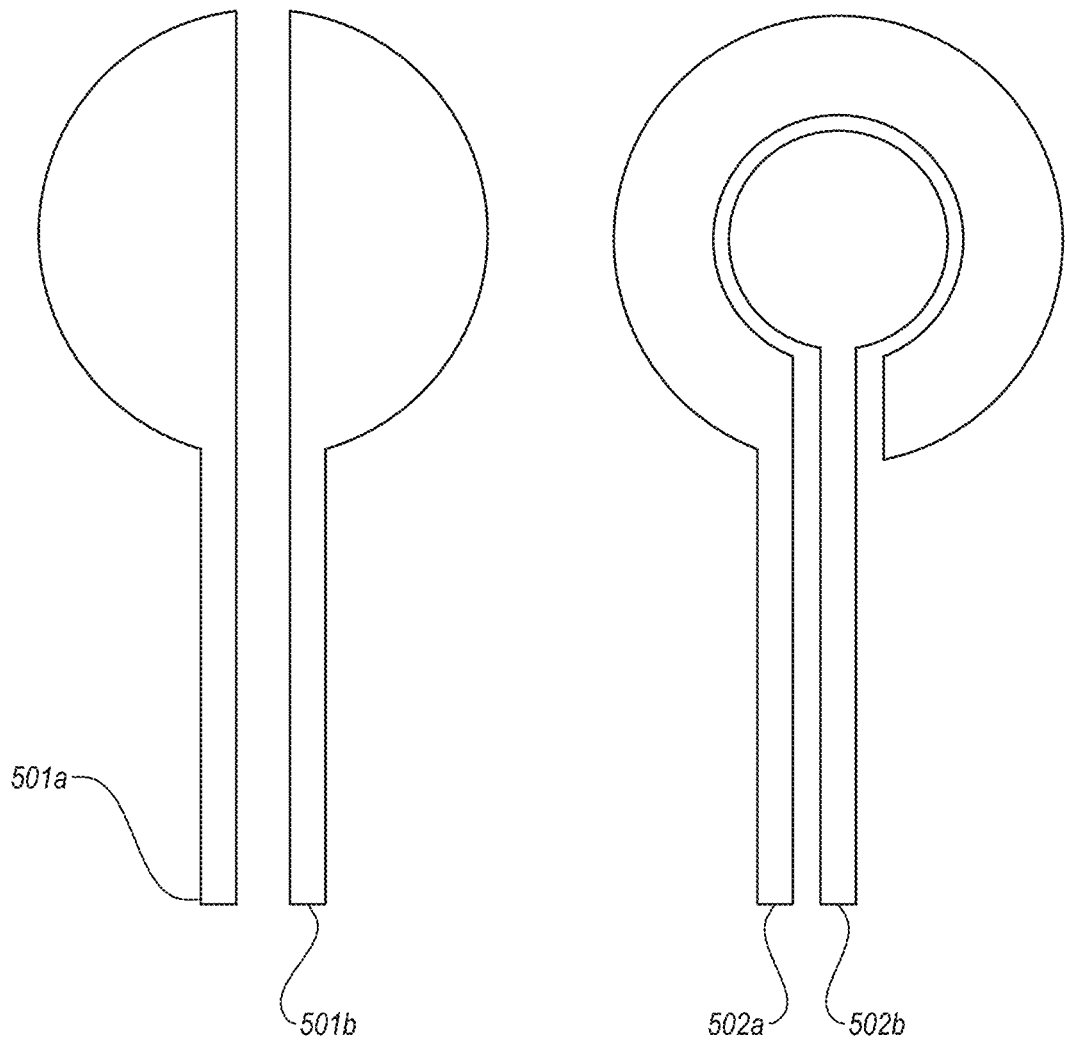
FIG. 5 illustrates conductive material that form part of a sensing device.

FIG. 5 illustrates conductive material that may form part of a sensing device, in accordance with some embodiments of the present disclosure. The conductive material that forms a layer of a sensing device may be separate into at least two regions. For example, the conductive material may include a first region 501a and a second region 501b that are located spatially next to each other without any portion of one of the first region 501a or the second region 501b encompassing each other. Alternately or additionally, the conductive material may include a first region 502a and a second region 502b that may be separate into at least two regions with the first region 502a encompassing a portion or all of the second region 502b. The configuration of the conductive materials in the embodiments illustrated in FIG. 2, FIG. 3, and/or FIG. 4 may be different than that illustrated. For example, in some embodiments, the conductive materials 212, 312a, 312b, 408a, 408b, or 412, may include a first region and a second region as illustrated in FIG. 5 or may include other configurations. Modifications, additions, or omissions may be made to FIG. 5 without departing from the scope of the present disclosure.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A sensing device comprising:
an integrated sensor stack including:
    a top substrate that includes a top surface of the integrated sensor stack;
    a bottom substrate that includes a bottom surface of the integrated sensor stack; and
    a first sensor of a first type between the top substrate and the bottom substrate, the first sensor including:
        a first conductive element;
        a second conductive element; and
        a reactive material between the first conductive element and the second conductive element; and
    a second sensor of a second type that is different from the first type and between the top substrate and the bottom substrate, the second sensor including:
        a third conductive element; and
        a second reactive material that is a different type of material than the reactive material and that is in between the third conductive element and the first conductive element, and
    the second sensor using the first conductive element as a conductive element that is separate from the third conductive element.

2. The sensing device of claim 1, wherein the integrated sensor stack further comprises a third sensor between the top substrate and the bottom substrate.

3. The sensing device of claim 2, wherein
the first sensor is a force sensitive resistor sensor,
the second sensor is a piezoelectric sensor, and
the third sensor is a capacitive sensor.

4. The sensing device of claim 2, wherein the first sensor, the second sensor, and the third sensor are arranged in an overlapping fashion in the integrated sensor stack such that a single interaction with the integrated sensor stack results in each of the first sensor, the second sensor, and the third sensor sensing the single interaction.

5. The sensing device of claim 4, wherein the single interaction is a force applied to the top surface of the integrated sensor stack.

6. The sensing device of claim 2, further comprising only three pins for outputting data from the first sensor, the second sensor, and the third sensor.

7. The sensing device of claim 2, wherein
the third sensor uses one of the first conductive element, the second conductive element, and the third conductive element as a conductive element.

8. A sensing device comprising:
a first sensor of a first sensor type configured to measure a force, the first sensor including a first conductive element and a second conductive element;
a second sensor directly coupled to the first sensor and being of a second sensor type that is different than the first sensor type, the second sensor including a third conductive element and using the first conductive element of the first sensor as a conductive element that is separate from the third conductive element in the second sensor; and
a third sensor directly coupled to the first sensor and being of a third sensor type that is different from the first sensor type and from the second sensor type, the third sensor including a fourth conductive element and using the second conductive element of the first sensor as a conductive element that is separate from the fourth conductive element in the third sensor.

9. The sensing device of claim 8, wherein the first sensor is a piezoelectric sensor and the second sensor is a force sensitive sensor or the first sensor is a piezoelectric sensor and the second sensor is a capacitive sensor.

10. The sensing device of claim 8, wherein the first sensor and the second sensor are arranged in a vertically overlapping fashion.

11. The sensing device of claim 8, wherein a single interaction with the sensing device results in each of the first sensor, the second sensor, and the third sensor sensing the single interaction.

12. A sensing device comprising:
a first sensor of a first type, the first sensor including:
    a first conductive element;
    a second conductive element; and
    a reactive material between the first conductive element and the second conductive element; and
a second sensor of a second type that is different from the first type, the second sensor including:
    a third conductive element; and
    a second reactive material that is a different type of material than the reactive material and that is in between the third conductive element and the first conductive element, and
    the second sensor using the first conductive element as a conductive element that is separate from the third conductive element.

13. The sensing device of claim 12, wherein the reactive material is a piezoelectric material or a piezoresistive material.

14. The sensing device of claim 12, wherein the first sensor and the second sensor are arranged in a vertically overlapping fashion.

15. The sensing device of claim 12, wherein a single interaction with the sensing device results in each of the first sensor and the second sensor sensing the single interaction.

16. The sensing device of claim 12, further comprising a third sensor of a third type that is different from the first type and from the second type, the third sensor using the second conductive element as a conductive element in the third sensor.

* * * * *